(12) United States Patent
Finot et al.

(10) Patent No.: US 7,952,057 B2
(45) Date of Patent: May 31, 2011

(54) REFLECTIVE SURFACE FOR SOLAR ENERGY COLLECTOR

(75) Inventors: Marc A. Finot, Palo Alto, CA (US);
Jason R. Wells, San Francisco, CA (US)

(73) Assignee: Skyline Solar, Inc., Mountain View, CA (US)

( * ) Notice: Subject to any disclaimer, the term of this patent is extended or adjusted under 35 U.S.C. 154(b) by 0 days.

(21) Appl. No.: 12/728,149

(22) Filed: Mar. 19, 2010

(65) Prior Publication Data

US 2010/0236626 A1      Sep. 23, 2010

Related U.S. Application Data

(60) Provisional application No. 61/162,125, filed on Mar. 20, 2009.

(51) Int. Cl.
*F24J 2/38* (2006.01)
(52) U.S. Cl. ............ 250/203.1; 136/259; 126/573; 126/684
(58) Field of Classification Search .......... 250/203.1; 136/259; 126/684, 573, 601
See application file for complete search history.

(56) References Cited

U.S. PATENT DOCUMENTS

| | | | |
|---|---|---|---|
| 4,337,758 A * | 7/1982 | Meinel et al. | 126/684 |
| 6,994,082 B2 | 2/2006 | Hochberg et al. | |
| 2006/0249143 A1 | 11/2006 | Straka | |
| 2008/0047605 A1 * | 2/2008 | Benitez et al. | 136/259 |
| 2008/0223443 A1 * | 9/2008 | Benitez et al. | 136/259 |
| 2009/0056698 A1 | 3/2009 | Johnson et al. | |
| 2009/0084375 A1 * | 4/2009 | Xie | 126/684 |
| 2009/0188562 A1 * | 7/2009 | Pavlak | 136/259 |
| 2010/0163014 A1 * | 7/2010 | Johnson et al. | 126/573 |

OTHER PUBLICATIONS

International Search Report dated Nov. 26, 2010 from International Application No. PCT/US2010/028047.
Written Opinion dated Nov. 26, 2010 from International Application No. PCT/US2010/028047.
U.S. Appl. No. 12/100,726, filed Apr. 10, 2008.
U.S. Appl. No. 12/124,124, filed May 20, 2008.
U.S. Appl. No. 12/124,118, filed May 20, 2008.
U.S. Appl. No. 12/124,121, filed May 20, 2008.

* cited by examiner

*Primary Examiner* — Tony Ko
(74) *Attorney, Agent, or Firm* — Beyer Law Group LLP

(57) ABSTRACT

Concentrating solar collector systems that utilize a concentrating reflector to direct incident solar radiation to a solar receiver are described. In one aspect, the reflective surface is arranged to direct light to the receiver in a non-imaging manner in which the solar rays reflected from the opposing edges of the reflective surface are generally directed towards a central portion of the solar receiver. Rays reflected from selected central portions of the reflective surface are directed closer to the edges of the receiver than the solar rays reflected from the edges of the reflective surface. The described reflectors are generally intended for use in solar collector systems that track movements of the sun along at least one axis.

18 Claims, 11 Drawing Sheets

US 7,952,057 B2

REFLECTIVE SURFACE FOR SOLAR ENERGY COLLECTOR

CROSS REFERENCE TO RELATED APPLICATIONS

This application claims the priority of U.S. Provisional Patent Application No. 61/162,125 filed Mar. 20, 2009 which is incorporated herein by reference.

BACKGROUND OF THE INVENTION

The highest cost components of a solar photovoltaic system are the solar cells that convert sunlight to electricity by the photoelectric effect. To use these cells more effectively, concentrating photovoltaic systems focus sunlight from a larger aperture onto a smaller cell area. Although concentrating photovoltaic designs use less active cell material, they typically require additional structure such as mirrors, lenses and heat sinks, and are fundamentally limited to utilizing less then all of the total available light. These factors increase cost and system complexity and reduce the optical-to-electrical efficiency over non-concentrating photovoltaic systems.

Although existing concentrating solar photovoltaic systems work well, there are continuing efforts to further improve the design and cost effectiveness of concentrating photovoltaic systems.

SUMMARY OF THE INVENTION

Concentrating solar collector systems that utilize a concentrating reflector to direct incident solar radiation to a solar receiver are described. In one aspect, the surface of the reflector is arranged to direct light to the receiver in a non-imaging manner in which the solar rays reflected from the opposing edges of the reflective surface are generally directed towards a central portion of the solar receiver. Rays reflected from selected central portions of the reflective surface are directed closer to the edges of the receiver than the solar rays reflected from the edges of the reflective surface. The described reflectors are generally intended for use in solar collector systems that track movements of the sun along at least one axis.

A variety of reflector surface geometries are describe that facilitate the described non-imaging reflection of the incident radiation. By way of example, the reflector may include a plurality of reflective sections, with at least some of the reflective sections having a geometry that varies from a reference parabola that approximates a cross sectional shape of the reflective surface. In various embodiments, one or more sections of the reflector have curvatures that are greater than that of the reference parabola, while other sections have curvatures that are less than that of the reference parabola. By way of example, in some embodiments, the angular deviation of the reflective surface from the reference parabola varies substantially linearly such that a second derivative deviation of the reflective surface from the reference parabola is substantially constant. Each reflective surface section is preferably angularly and spatially continuous. However, in some embodiments the reflector may be made up of more than one distinct reflector segments that are angularly and/or spatially discontinuous from each other.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic, not to scale and may not depict intended curvatures and/or angles properly.

DETAILED DESCRIPTION OF THE PREFERRED EMBODIMENTS

The present invention relates generally to concentrating photovoltaic (CPV) systems. Various aspects of the present invention relate to a reflective surface that concentrates sunlight onto a solar receiver in a largely non-imaging manner. The reflective surface is arranged to help minimize energy losses attributed to the misalignment of the edges of the reflective surface. Various embodiments of the reflective surface are angularly and spatially continuous and/or distribute light more uniformly across the surface of the solar receiver. Such features can improve the efficiency of solar energy collection and facilitate the manufacture of the reflective surface.

Figure 1A:
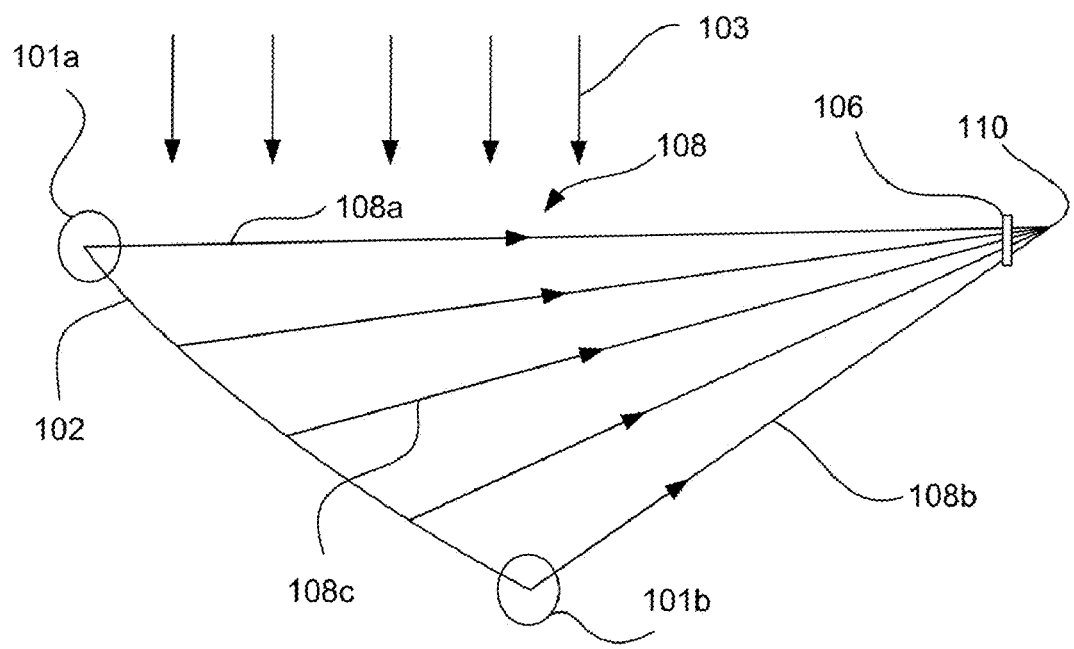
FIG. 1A is a diagrammatic cross-sectional view of a quarter parabolic reflector and a solar receiver as described in U.S. patent application Ser. No. 12/100,726.
Figure 1B:
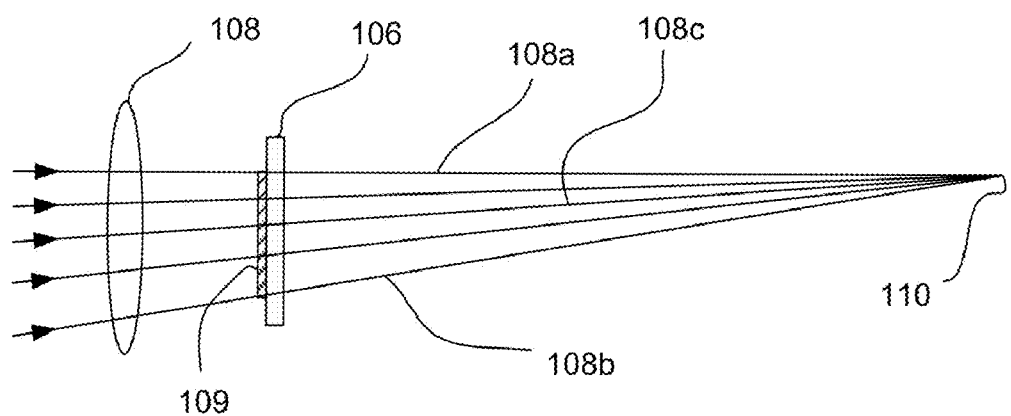
FIG. 1B is a simplified diagrammatic cross-sectional view of the receiver of FIG. 1A.

The present invention represents an improvement upon various reflector designs described in U.S. patent application Ser. No. 12/100,726, entitled "Dual Trough Concentrating Solar Photovoltaic Module," filed Apr. 10, 2008, which is incorporated herein in its entirety for all purposes and is referred to hereinafter as the '726 application. To appreciate the advantages of the reflective surface, it is helpful to examine a parabolic reflector according to one embodiment of the invention described in the '726 application. FIG. 1A is a cross-sectional view of such a quarter parabolic reflector 102 and a solar receiver 106. Here the term quarter parabolic reflector refers to a parabolic segment used in a similar manner to that described in U.S. patent application Ser. No. 12/100,726, which is incorporated herein by reference. Quarter parabolic reflector 102, which extends longitudinally, reflects incident sunlight 103 such that representative rays 108, which emanate from evenly spaced points on the parabolic reflector 102, would form a focal point 110. The focal point 110 is situated beyond the receiver 106, which causes rays 108 to be spread across the surface of the receiver 106 in a largely imaging manner FIG. 1B is an enlarged view of the receiver 106, which has one or more solar cells 109.

The above approach, although effective in many applications, can be improved. For example, the edges 101 of the parabolic reflector 102 are typically more vulnerable to misalignment than the central portions of the parabolic reflector 102. Such misalignment can be caused by damage, wear and tear and/or tracking errors. In the illustrated embodiment, there is a fairly direct correspondence between the relative location on the parabolic reflector 102 from which a ray 108 extends and the relative location on the solar cell 109 that the ray 108 contacts. For example, rays 108 that emanate from the edges 101 (such as rays 108a and 108b) and central portions (such as ray 108c) of the parabolic reflector 102 tend to extend towards the edges and central portions, respectively, of the solar cell 109. If the aforementioned misalignment alters the trajectory of rays emanating from the edges 101 of the parabolic reflector 102 (e.g., rays 108a and 108b), the rays may miss the solar cell 109 entirely.

It should also be appreciated that the rays 108 are not evenly spread across the solar cell 109. In the illustrated embodiment, the number of rays 108 in the upper half of solar cell 109 is greater than the number of rays 108 in the lower half. This indicates that the light intensity on some portions of the solar cell 109 is significantly greater than in other portions. Such an uneven distribution can result in the formation of regions of particularly high current density on the surface of the solar cell 109, which in turn can lead to the formation of high temperature "hot spots" that degrade the performance, reliability and efficiency of the solar cell 109.

Various embodiments of the present invention pertain to a solar energy collector with a reflective surface configured to address at least some of the above concerns. In the described embodiments, light rays reflected from lower tolerance regions of the reflective surface may be directed to regions of the receiver that can better accommodate unintended changes in the trajectory of the light rays. For example, the reflective surface directs light from its edges towards the central portions, rather than the edges, of a solar cell, receiver and/or flux line. Various embodiments concentrate light in a largely non-imaging manner and distribute it more uniformly across the surface of a solar cell.

Figure 2A:
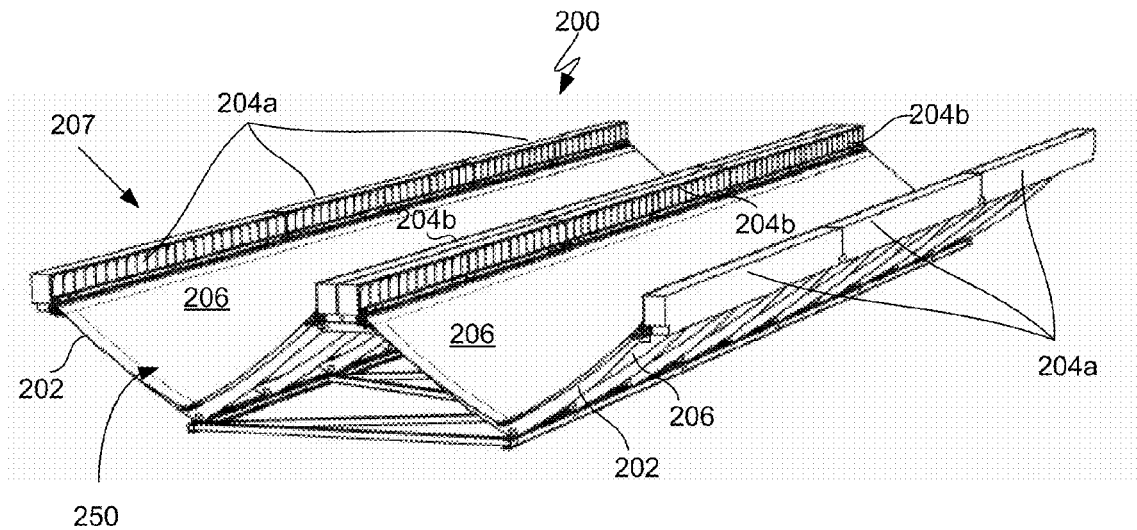
FIG. 2A is a diagrammatic perspective view of a solar energy collector according to one embodiment of the present invention.

FIG. 2A is a perspective view of a solar energy collector 200 according to one embodiment of the present invention. The collector 200, which has a dual trough design, includes a support structure 202 that is arranged to support a reflector structure 207. Application of this invention is not limited to dual trough collector designs, but the invention may be beneficially applied to a wide range of trough style collector designs. The reflector structure 207 has multiple reflector panels 206 with one or more reflective surfaces. The reflective surfaces of the reflector panels 206 are arranged to direct incident sunlight toward solar receivers 204, which each include one or more solar cells and are coupled near the top edges of reflector structure 207. The collector 200 can include any other feature described in the '726 application as well.

Figure 2B:
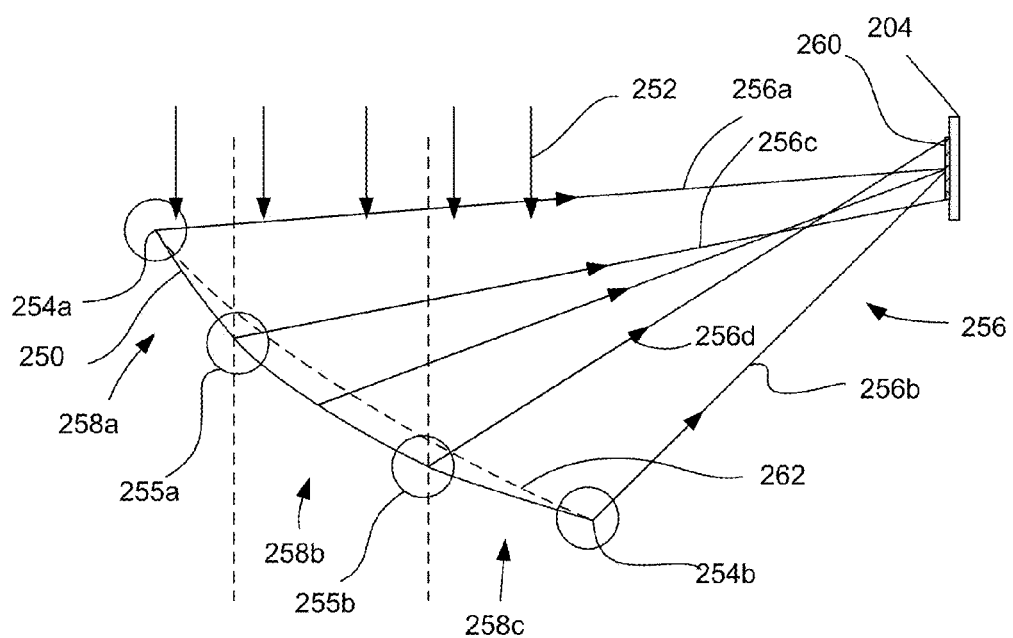
FIG. 2B is a diagrammatic cross-sectional view of a reflective surface and a solar receiver according to one embodiment of the present invention.

FIG. 2B is an enlarged, cross-sectional view of a reflective surface 250 of the reflector panel 206 and a solar receiver 204. As indicated by rays 256, incident sunlight 252 is reflected off of reflective surface 250 to form a flux line 260 on the receiver 204. (The flux line 260 can be understood as an illuminated region on the receiver that is formed at least substantially from the incident sunlight reflected from the reflective surface 250.) A reflective surface of this type has been referred to as a quarter parabola segment in the '726 application.

The design of the reflective surface 250 helps maximize the reception of solar energy by receiver 204 and keep the flux line 260 within the boundaries of the solar cells (not shown) on the receiver 204. To this end, the edges 254 of the reflective surface 250, which can be prone to misalignment due to manufacturing and/or tracking errors, are configured to reflect rays towards a central region of the flux line 260 and/or the receiver 204. In the illustrated embodiment, rays that are reflected closer to the outer edges of reflective surface 250 (e.g., rays 256a and 256b from edges 254a and 254b) tend to be directed more towards the center of receiver 204. Rays that are reflected closer to central portions of the reflective surface 250 (e.g., rays 256c and 256d from central portions 255a and 255b) tend to be directed more towards the edges of receiver 204 than the rays reflected closer to the edges of the reflective surface 250. This configuration can reduce solar energy losses by helping to direct rays from portions of the reflective surface 250 (e.g., edges 254) that have lower tolerance to portions of the receiver 204 that can tolerate misaligned rays with minimal impact on cell performance (e.g., central portions of the receiver 204 and/or flux line 260).

The receiver 204 and the reflective surface 250 can be arranged in various ways, depending on the needs of a particular application. In various embodiments, the receiver 204 and reflective surface 250 are positioned such that at least rays 256a and 256b, which emanate from the outer edges of reflective surface 250, intercept each other approximately in or near the center of the flux line 260. A tracking system can help position the reflective surface 250 such that incoming sunlight 252 is substantially normal to the directrix (not shown) of a reference parabola 262 upon which reflective surface 250 is based.

The reflective surface 250, unlike reference parabola 262, does not form a parabolic curve with a single directrix and focus. In various embodiments, each one of the sections 258 of the reflective surface 250 may form a different parabolic curve with a distinct directrix and focus. As a result, the reflective surface 250 does not produce a single focus and concentrates light in a substantially non-imaging manner.

In some embodiments, there is a relationship between points on the reflective surface 250 and points on the reference parabola 262. For example, various points on the reflective surface 250 can deviate by a predetermined amount from the corresponding points on the reference parabola 262. The amount and type of deviation can depend on the section 258. (In the illustrated embodiment, three sections 258a, 258b and 258c are described, although there could be fewer or more sections.) For example, there is a higher curvature at various points in sections 258a and 258c than in the corresponding points of the reference parabola 262. There is a lower curvature at various points in section 258b than in the corresponding points of the reference parabola 262. The amount of curvature deviation from the reference parabola can be substantially constant, the same and/or different for various points within any given section. The shape of the edges 254 of the reflective surface 250 can be substantially identical to the shape of the edges of the reference parabola 262. That is, at least portions of the edges 254, which overlap the edges of the reference parabola 262, may reflect light in the same way and have the same spatial orientation and position as the overlapped portions of the reference parabola 262.

Another embodiment of a reflective surface 300, its corresponding sections 312 and a reference parabola 302 will be described with reference to FIG. 3A. In the illustrated embodiment, the reflective surface 300 is substantially symmetrical (e.g., section 312c intercepts as much incoming sunlight as section 312a), although other relations between the section sizes are also possible. The shape of each section 312 of the reflective surface 300 is partly based on corresponding sections of the reference parabola 302.

Reference parabola 302 is at least partially defined by a directrix (not shown), which is parallel to the X-axis, 310, and perpendicular to the y-axis 311. The general form for the mathematical equation that describes a parabola is $(Ax+By)^2+Cx+Dy+E=0$, where A, B, C, D, and E are constants. Equivalently a parabola is defined as the loci of points equidistant from a point, called the focus, and a line, called the directrix. The reference parabola 262 has a directrix parallel to the X-axis, allowing the equation defining the reference parabola to be simplified to $y=k*(x-a)^2+b$, Equation (1), where a, b, and k are constants. Since the reference parabola has an upward facing opening k is positive. Taking the second derivative of the preceding parabola function yields $d^2y/dx^2=2k$, implying that the second derivative is constant independent of position. The reference parabola curvature, $\kappa$, is defined as $\kappa=(d^2y/dx^2)/([1+(dy/dx)^2]^{3/2})$ or equivalently $\kappa=2k/([1+(dy/dx)^2]^{3/2})$. The curvature at the center of the parabola is equal to 2k since dy/dx=0 at that point. The shape of each section 312 of the reflective surface 300 may be defined, at least partially, by a variation in k or curvature from the reference parabola 302.

The form of the reference parabola 302 can vary widely. Although only one shape for the reference parabola 302 is shown, any of an almost infinite range of parabolic shapes can be used, depending on the needs of a particular application.

The term "parabola" can be defined in various ways known in the art. In the illustrated embodiment, the reference parabola 302 is represented by a curve that begins and ends at the same endpoints as the curve formed by the cross-sectional view of the reflective surface 300 and is made of a locus of points that are equidistant from a focal point and a directrix. The reference parabola 302 can help determine various parameters of the reflective surface 300. For example, portions of the edges 306 of the reflective surface 300 and portions of the edges of the reference parabola 302 can overlap and have the same position and slope. Points along the curve formed by reflective surface 300 can be designed in part based on corresponding points on the reference parabola 302.

Various approaches can be taken in corresponding points between the reference parabola 302 and the reflective surface 300. In the illustrated embodiment, the point-to-point correspondence is based on X-axis 310. For example, point 308a on reflective surface 300 corresponds with point 308b on reference parabola 302, because they share the same relative X position on X-axis 310. Such correlations can be based on other and/or additional metrics, such as a differently configured axis, an equation relating distances along the reference parabola 302 and the reflective surface 300, etc.

In the illustrated embodiment, the second derivative of a particular point on reflective surface 300 is based at least partly on the second derivative of a corresponding point on the reference parabola 302 and an additional second derivative value that may vary depending on the section 312 that the point is situated in. The additional second derivative value can be at least substantially the same and/or different for two or more sections 312.

Figure 3A:
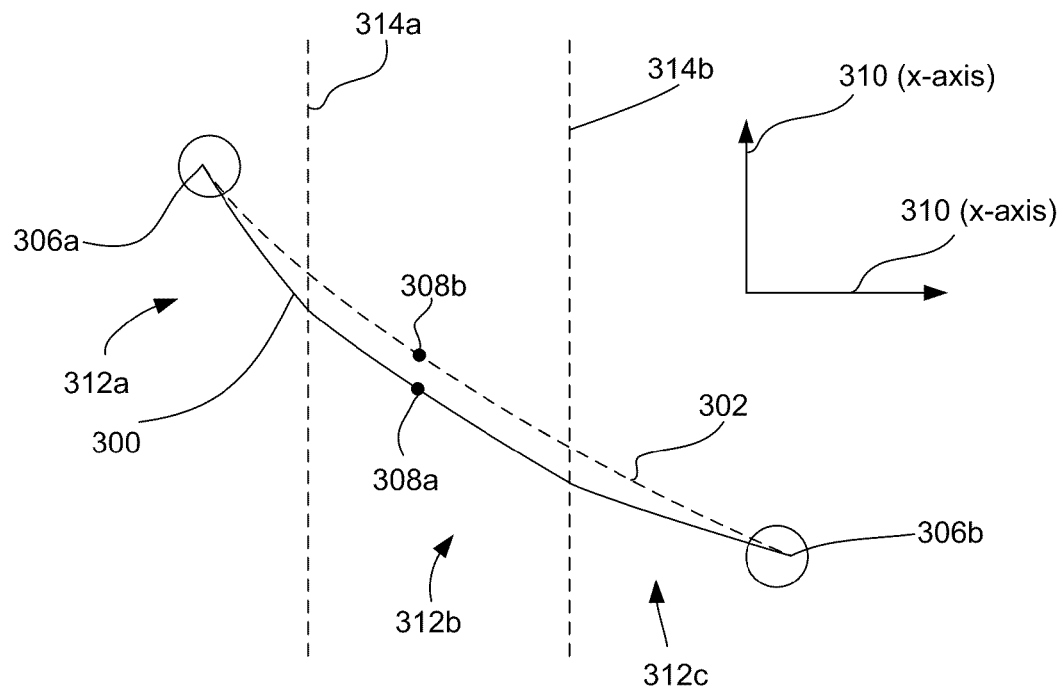
FIG. 3A is a diagrammatic cross-sectional view of a reflective surface and a reference parabola according to one embodiment of the present invention.
Figure 3B:
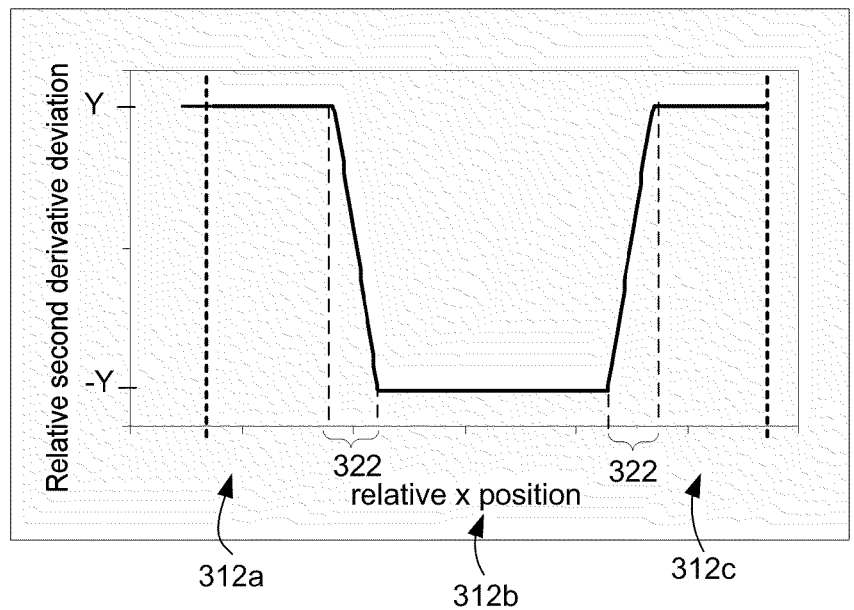
FIG. 3B is an exemplary graph depicting the relative second derivative deviation of a reflective surface from a reference parabola as a function of relative X position according to one embodiment of the present invention.

FIG. 3B depicts the second derivative deviation of the reflective surface 300 relative to the reference parabola 302 as a function of the relative X position along X-axis 310 of FIG. 3A. In the illustrated embodiment, the amount of second derivative deviation tends to be substantially constant within a section 312, although this is not a requirement. For example, for most points in sections 312a and 312c of the reflective surface 300, the second derivative at a particular point is equal to the second derivative at the corresponding point on the reference parabola plus a second derivative value Y, Y being a positive value. For most points in section 312b, the second derivative at a particular point is equal to the second derivative at the corresponding point on the reference parabola plus a second derivative value X. In this example, X is equal to −Y. The absolute value of the additional second derivative value does not have to be the same for two or more sections 312, although such a feature can help simplify the manufacture and design of the reflective surface 300. It should be noted that there are transitional regions 322 in which the relative second derivative deviation changes from positive Y to X. Such regions may be situated between sections 312 or constitute parts of sections 312. The rate of such change is depicted as having a constant slope, although the rate of change could be increasing or decreasing.

Figure 3C:
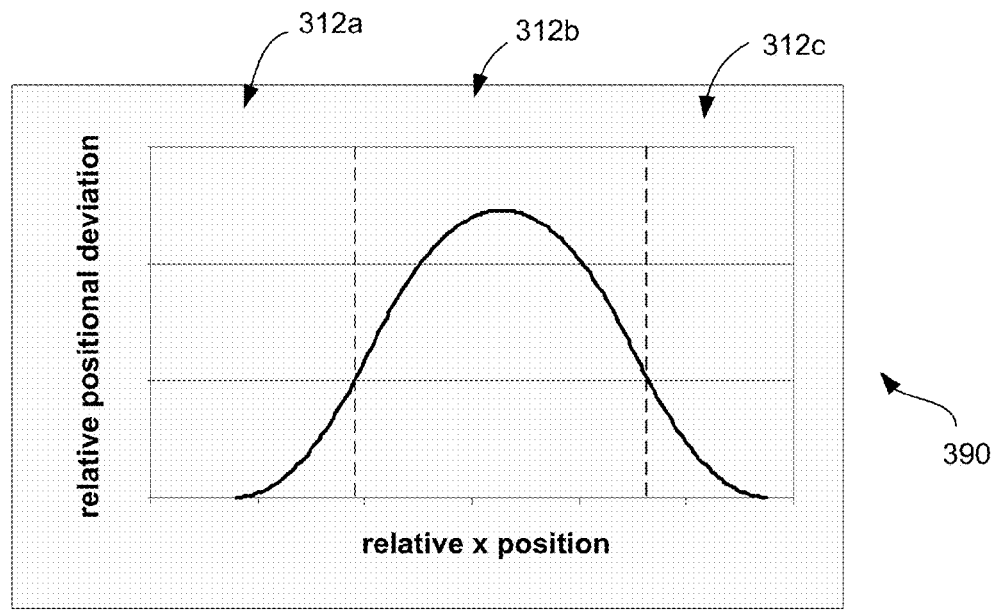
FIG. 3C is an exemplary graph depicting the positional deviation of a reflective surface from a reference parabola as a function of relative X position according to one embodiment of the present invention.

FIG. 3C illustrates the positional deviation of the reflective surface 300 from the reference parabola 302 as a function of the relative X position using the X-axis of FIG. 3A. Dashed lines indicate the parts of the graph 390 that correspond to sections 312a, 312b and 312c of FIG. 3A. In section 312a, the positive second derivative deviation (as shown in FIG. 3B) causes the reflective surface 300 to bend away from the reference parabola 302 at an increasing rate. In section 312b, the negative second derivative deviation causes the reflective surface 300 to bend back toward the reference parabola 302. In section 312c, the positive second derivative deviation causes the reflective surface 300 to bend toward the reference parabola 302 at a decreasing rate.

The smooth profile of the curve in graph 390 indicates that the reflective surface 300 is spatially continuous. Reflective surface 300 can also substantially lack any angular discontinuities and/or sharp edges. In some embodiments, a function approximating the reflective surface 300 and the first derivative of the function are continuous across the entire reflective surface 300. Mathematically one method to accomplish this is by adjusting the values of the constants a and b in Equation 1 so that functions which describe the various sections 312 have equal values and first derivatives at their boundaries. In this case the directrices that partially define all of the parabolic sections are parallel. Spatial and angular continuity can be advantageous for at least two reasons. First, spatial and/or angular discontinuities can create difficulties in manufacturing. Sheets, for example, that include such discontinuities can be more prone to breaking and can require more tooling to produce. The reflective surface 300, for example, can be formed from a single sheet of reflective material and need not be formed from separate sheets or pieces that have been welded, adhered and/or bonded together. Second, sharp edges can promote the scattering of incoming sunlight. This can make it more difficult to maximize the concentration of sunlight on a receiver.

Figure 3D:
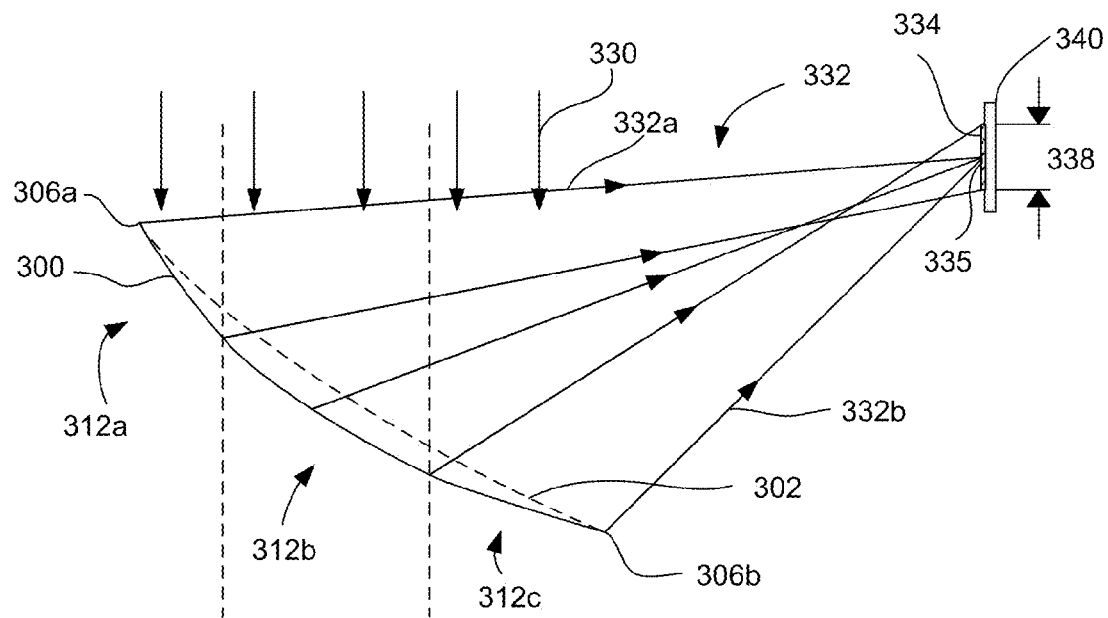
FIG. 3D is a diagrammatic cross-sectional view of a reflective surface and a receiver according to one embodiment of the present invention.
Figure 3E:
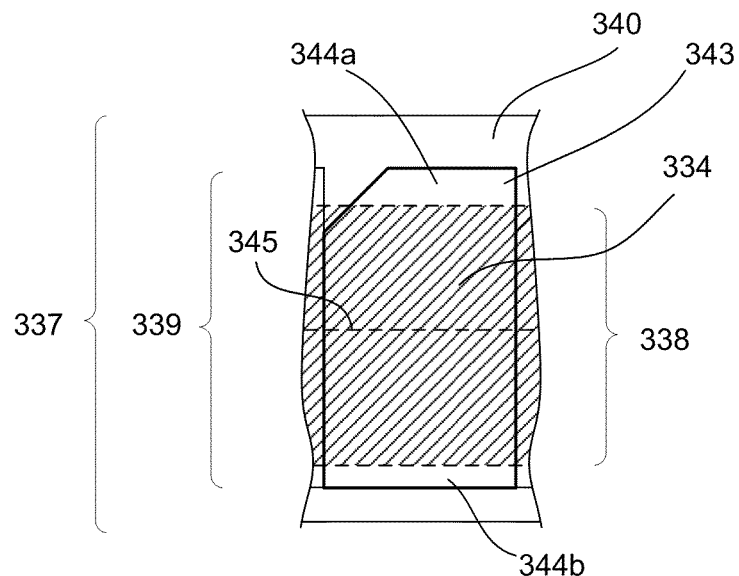
FIG. 3E is a diagrammatic plan view of a flux line on a solar panel and a receiver according to one embodiment of the present invention.

Referring to FIGS. 3D and 3E, various approaches for arranging the reflective surface 300, the incident light 330 and the solar receiver 340 will be described. Reflective surface 300 reflects incident sunlight 330 and directs rays 332 toward the solar receiver 340. The incoming sunlight 330 is substantially normal to the directrix (not shown) of the reference parabola 302. The sunlight reflected by the reflective surface 300 forms a flux line 334 (with a width 338) on the receiver 340.

In various embodiments one or more sections 312 of the reflective surface 300 can form a distinct parabolic curve with a distinct directrix and focus. The foci corresponding to the different sections 312 may not be coincident and the directrices corresponding to the different sections 312 may not be parallel. As a result, incident sunlight 330, which is preferably substantially normal to the directrix of the reference parabola 302, is concentrated in a non-imaging manner. The edges 306 of the reflective surface 300 may have substantially the same spatial orientation and slope as at least portions of the edges of the reference parabola 302. Such edge portions thus reflect light in a manner similar to the reference parabola 302. In the illustrated embodiment, for example, the outer edges of the reflective surface 300 direct light rays 332a and 332b towards a point 335. Edges 306 of the reflective surface 300 are arranged and distanced from the receiver 340 such that the point 335 is in a central region of the flux line 334 and/or the receiver 340. This approach is different from the one described in connection with FIG. 1B, where the focal point 210 was situated behind the receiver 206. Such an arrangement and distancing helps reflective surface 300 form a more uniform flux line 334 and/or direct light more accurately from the edges 306 of the reflective surface 300 to the more central portions of the receiver 340.

FIG. 3E provides an enlarged plan view of the receiver 340 and the flux line 334, which is marked by the shaded region. In FIG. 3E, the view of the receiver 340 has been rotated 90° relative to the cross-sectional view provided in FIG. 3D. The receiver 340 may have one or more solar cells 343 that can extend longitudinally across the receiver 340. The solar cells 343 use the concentrated incident solar energy to directly produce electricity. Alternatively, the receiver may use the concentrated incident solar energy to heat a fluid or perform some other beneficial operation. The flux line 334 can be understood as a region on the solar receiver 340 that is illuminated through sunlight reflected from the reflective surface 300 of FIG. 3D. In some embodiments, the center of the flux line 345 is substantially nominally coincident with the center of the receiver 340 and/or solar cells 343. The flux line 334 can extend over all, substantially all and/or the majority of the surface area of the one or more solar cells 343. Alternatively the flux line 334 may extend over a minority of the solar cell surface area 343, which provides tolerance for tracking errors and mechanical inaccuracies in the collector assembly. FIG. 3E depicts the flux line 334 as intersecting with a portion of the receiver 340 that is not part of the solar cell 343 i.e., the region near the beveled edge of the cell 343, although in various embodiments the flux line 343 may be entirely within the periphery of the one or more solar cells 343. In the illustrated embodiment, the flux line 334 does not extend over buffer regions 344a and 344b of the solar cell 343 and the width of the flux line 338 is slightly smaller than the width 339 of the solar cell 343 and the width of the receiver 337. Buffer regions 344 can be located anywhere along the periphery of the cell 343, such as along the top and bottom edges of the cell 343. Although reflective surface 300 is designed to target reflected rays within the boundaries of flux line 334, manufacturing and/or tracking errors can cause reflected light to strike the receiver 340 in a region outside of the intended flux line 334. Buffer regions 344 can catch errant rays and help reduce the loss of solar energy.

Figure 3F:
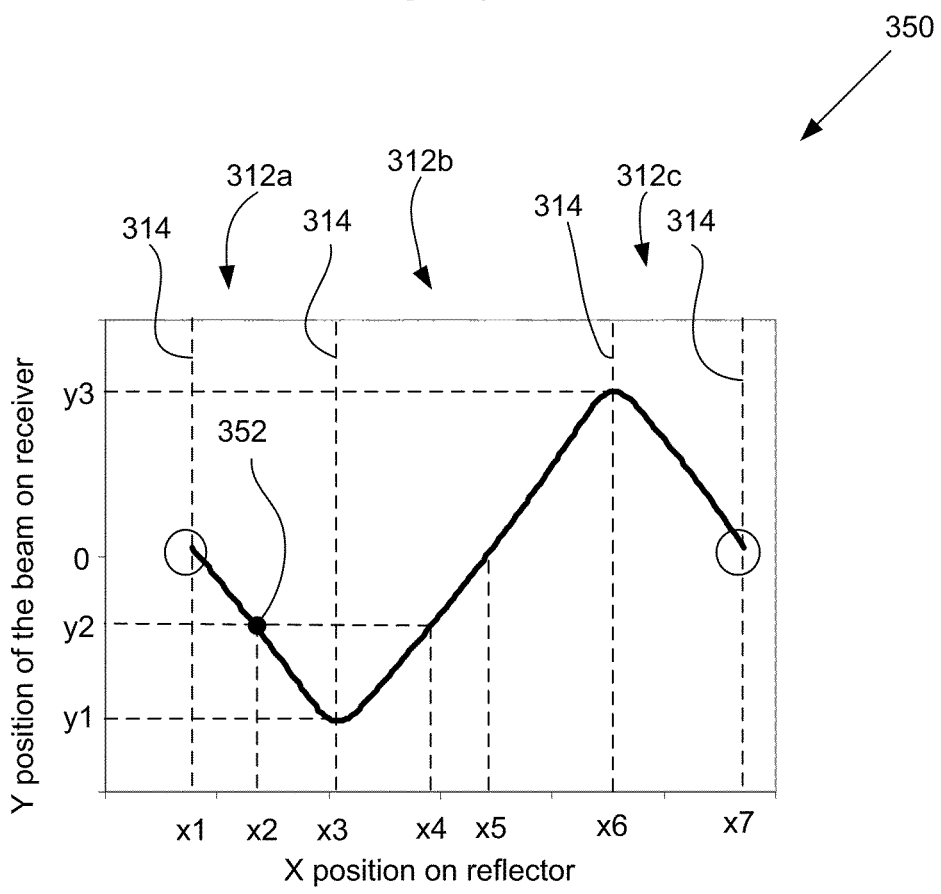
FIG. 3F is an exemplary graph depicting the position of a beam on a receiver as a function of the X position on a reflective surface according to one embodiment of the present invention.

FIG. 3F is a graph 350 that maps various points on reflective surface 300 to points on the receiver 340 of FIG. 3D. The vertical axis represents positions along the width of the receiver 337 of FIG. 3E. The distance between y1 and y3 on the vertical axis represents the width of the flux line 338 of FIG. 3E and the value of 0 along the vertical axis indicates the center 345 of the width of the flux line 338. The horizontal axis represents a relative X position on the reflective surface 300 (e.g., based on X axis 310 of FIG. 3A.) Dotted lines 314 delineate sections 312a, 312b and 312c. The graph 350 indicates where a particular ray that is reflected off of a point on the reflective surface 300 intersects with receiver 340. For example, point 352 indicates that incident sunlight reflects off point x2 in section 312a of the reflective surface 300 and is directed toward point y2 in the lower half of the flux line 334.

The graph 350 illustrates how the various sections 312 can help to distribute light more evenly across flux line 334. In the illustrated embodiment, section 312a directs light toward the lower half of the flux line 334 (e.g., the shaded region below center 345 in FIG. 3E) Section 312c directs light toward the upper half of the flux line 334 (e.g., the shaded region above center 345 in FIG. 3E.) The middle section 312b directs light over substantially the entire width of the flux line 338. Generally speaking, in the graph 350 two points (e.g., x2 and x4) on the reflective surface 300 map to one point on the receiver 340 (e.g., y2.). This can be untrue for parts of the curve of graph 350 that correspond to the center and edges of the flux line 334. In the illustrated embodiment, for example, the center of the flux line 345 (i.e., the value 0 on the vertical axis) corresponds to at least three points (e.g., x1, x5 and x7) on the reflective surface 300. The extreme outer edges of the flux line 334, which are positioned at y1 and y3, each correspond to only one point on the reflective surface 300 (i.e., points x3 and x6 respectively.)

It should also be appreciated that the edges of reflective surface 300, which correspond to x1 and x7 on horizontal axis of graph 350, map to the center of the flux line 345, which is designated with a 0 on the vertical axis of graph 350. Generally, the closer a point on the reflective surface 300 is to x1 or x7, the more the corresponding rays are directed towards the center of the flux line 345 and/or receiver 340 (i.e., the value of 0 on the vertical axis.) The edges of a reflective surface can be particularly vulnerable to damage, manufacturing defects and/or other sources of misalignment. If the edges of the reflective surface 300 are designed to direct light rays toward the outer edges of the flux line (as is the case with rays emanating from the edges of the reflective surface 102 of FIG. 1A), such misalignment can cause the light rays to fall outside of the intended flux line and perhaps entirely miss the solar cell on the receiver, which results in a loss of solar energy. Directing rays from the edges of the reflective surface 300 toward the center of the flux line 345 and/or receiver 340 can reduce the likelihood of such losses.

Figure 3G:
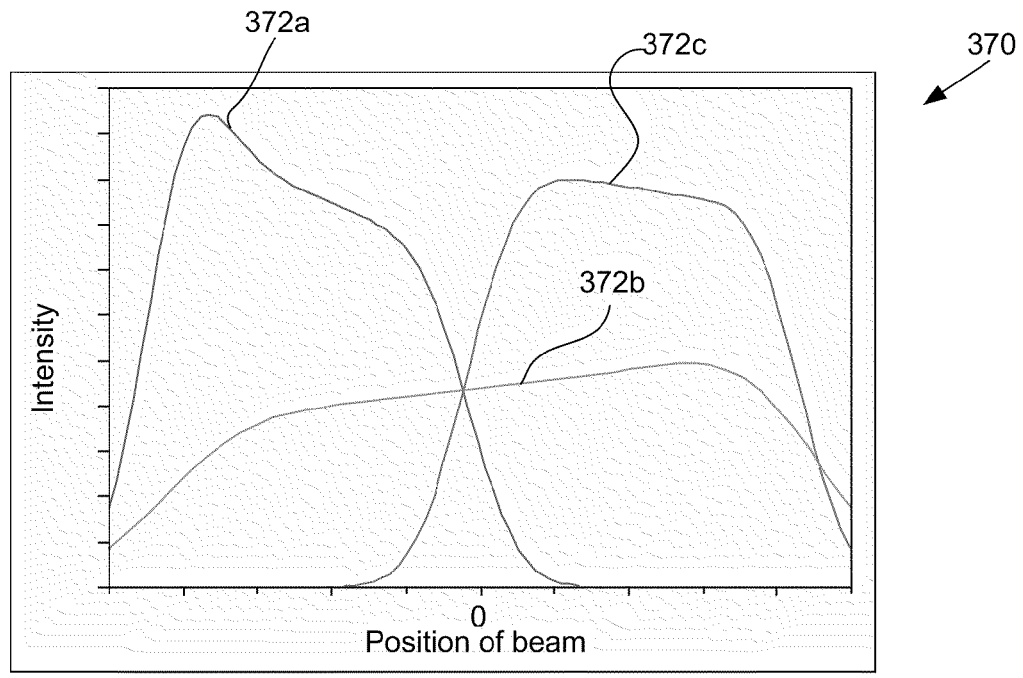
FIG. 3G is an exemplary graph depicting intensity as a function of the position on a receiver for sunlight reflecting from several reflective surface sections.

FIG. 3G includes a graph 370 that indicates light intensity as a function of a position along the width of the flux line 338 of FIG. 3E. The value of 0 on the horizontal axis corresponds to the center of the flux line (e.g., center 345 of FIG. 3E). Curves 372a, 372b and 372c correspond to sections 312a, 312b and 312c respectively of the reflective surface 300 of FIG. 3A. The graph 370 indicates that section 312a (as represented by curve 372a) directs light primarily over the lower half of the width of the flux line 338 of FIG. 3E. Middle section 312b (as represented by curve 372b) directs light fairly uniformly over the entire width of the flux line 338. Section 312c (as represented by 372c) directs light primarily over the upper half of the width of the flux line 338.

Figure 3H:
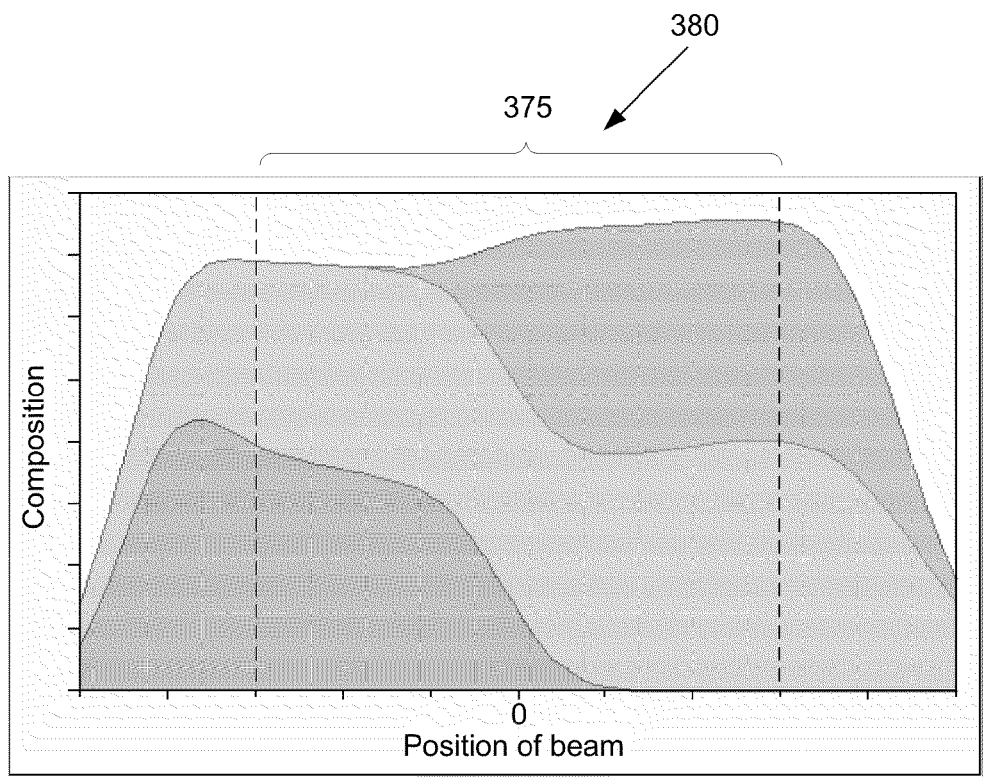
FIG. 3H is an exemplary graph depicting composite intensity as a function of the position of a beam on a receiver.

FIG. 3H includes a graph 380 showing the relative contributions of light reflected from sections 312a, 312b and 312c to the composite intensity at various points along the width 338 of the flux line 334. This graph 380 indicates that the overall intensity across the width 338 of the flux line 334 is relatively stable and uniform. In some embodiments, the variation in intensity in a central region 375 of the flux line 334 is approximately +1-10% or less. In another embodiment such variation is approximately +/−20% or less. The central region 375 can be defined as a portion of the flux line 334 that accounts for approximately 90% of the energy of the flux line 334, although other definitions are also possible. A more uniform light intensity can help improve heat dissipation from the solar cells, avoid resistive losses and promote cell efficiency.

Figure 4:
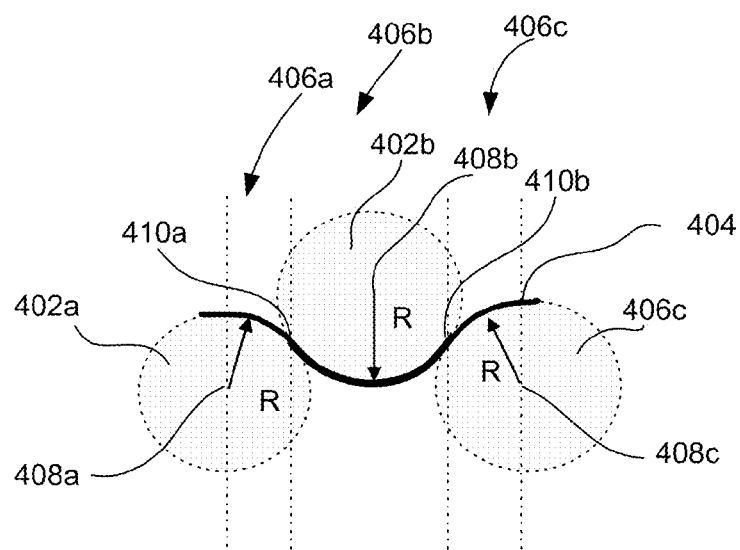
FIG. 4 is a diagrammatic cross-sectional view of a sheet deformed by mandrels according to one embodiment of the present invention.

In another aspect of the present invention, various exemplary methods for forming reflective surfaces are described. FIG. 4 presents one approach for manufacturing a reflective surface such as the reflective surface 300 of FIG. 3A. A substantially flat sheet of reflective material is positioned between the mandrels 402 in FIG. 4. The mandrels 402 each have a radius R, although two or more of the mandrels can have different radii as well. The flat sheet is inelastically deformed by the mandrels 402. The resulting deformed sheet 404 can be understood as having three sections 406a, 406b and 406c. (Once the processing of the deformed sheet 404 is completed, these sections 406a, 406b and 406c can correspond to and have the features of sections 312a, 312b and 312c respectively of FIG. 3A.)

In the illustrated embodiment, each of the three sections 406 has a curvature of radius R. Two or more of the sections 406 could have different curvatures that correspond to the radius of their underlying mandrels 402. The centers of curvature 408a and 408c for sections 406a and 406c, respectively, are situated below and face a first surface of the deformed sheet 404. The center of curvature 408b for section 406b is situated over and faces a second surface of the deformed sheet 404 that opposes the first surface. In some embodiments, inflection points such as inflection points 410a and 410b divide the sheet into portions that curve in a first direction or in an opposite second direction. The area of the portions that curve in the first direction can be approximately equal to the area of the portions that curve in the second direction. After the deformed sheet 404 has been shaped, it can be bowed to form a reflective surface having any of the features of reflective surface 300 of FIG. 3A. The bowing force can be applied at least in part by securing the deformed sheet 404 to a plurality of shaping ribs, as is discussed in previously cited '726 application.

Figure 5:
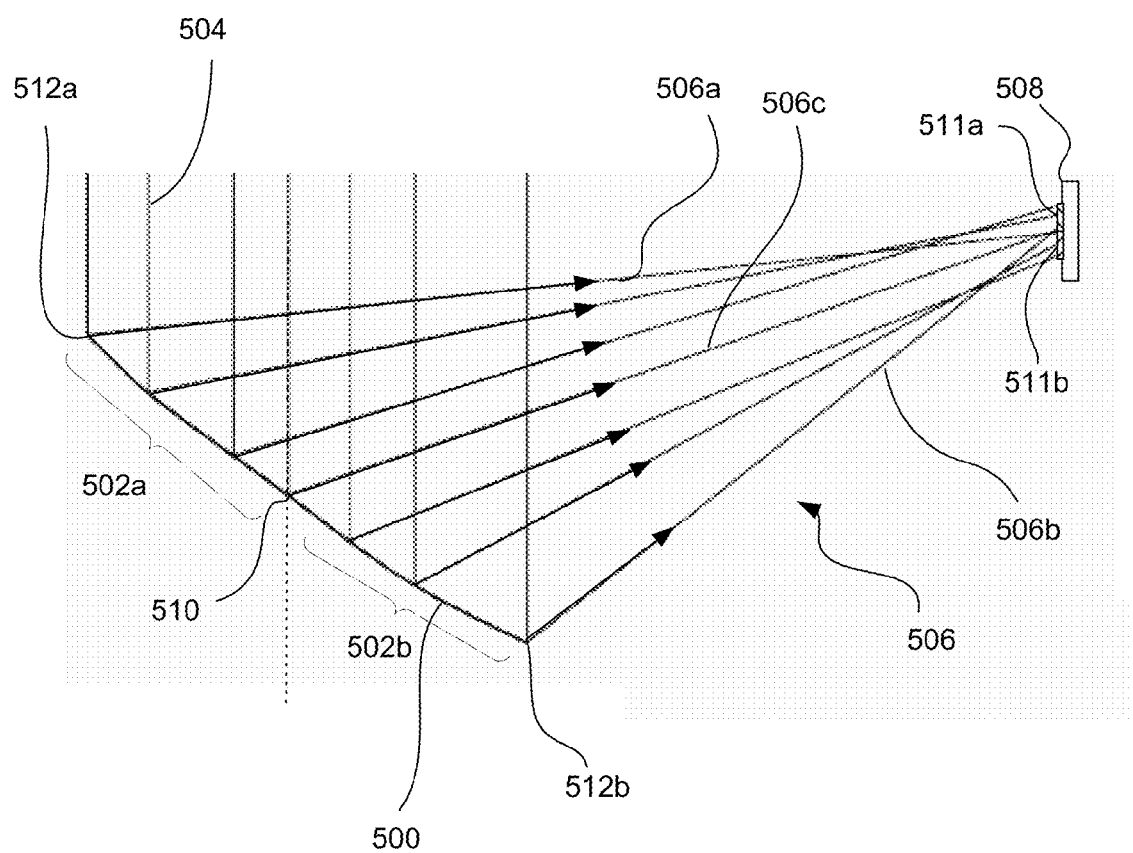
FIG. 5 is a diagrammatic cross-sectional view of a reflective surface and a receiver according to one embodiment of the present invention.

Another approach to manufacturing reflective surfaces is described in FIG. 5. FIG. 5 illustrates a cross-sectional view of a reflective surface 500 and solar receiver 508. Reflective surface 500 has regions 502a and 502b, midpoint 510 and outer edges 512a and 512b. Nominally incident sunlight 504 is reflected as rays 506 to form flux line 511 on the receiver 508.

The spatial and/or angular orientation of the reflective surface 500 can be configured such that various portions of the reflective surface 500 direct light to desirable sites on the receiver 508. In the illustrated embodiment, the outer edges 512a and 512b and the midpoint 510 of the reflective surface 300 are configured to direct corresponding rays 506a, 506b and 506c to the approximate center of the flux line 511. That is, particular portions of the receiver 508, such as the center of the flux line 511, are better positioned to capture solar energy even from rays that deviate slightly from their intended path. A ray, for example, that is originally directed at the center of the flux line 511 but that strays slightly from the exact center will likely still be received by a solar cell and usefully converted into energy. This may be less true for a ray that is targeted at an edge of a solar cell and/or a flux line. If such a ray deviates from its intended course, it may have a higher likelihood of intersecting with the receiver at a point outside the periphery of the solar cell. As a result, reflective surface 500 is configured such that rays reflected from lower tolerance regions of the reflective surface 500, such as outer edges 512a and 512b, are directed toward regions of the receiver 508 that can better accommodate such changes in the rays' trajectory, such as the center of the flux line 511. In various embodiments, region 502a, which is situated between upper edge 512a and the midpoint 510, can be configured to direct rays 506 across the lower half 511b of the flux line, such that the lower half 511a is substantially uniformly illuminated, although this is not a requirement. Region 502b, which is situated between the midpoint 510 and the lower edge 512b, can be optionally configured to substantially uniformly illuminate at least a portion of the upper half 511a of the flux line. A function defining the reflective surface 500 can be developed such that the function and its first derivative are continuous across the entire reflective surface 500 and its second derivative is continuous across each region 502. The reflective surface 500 and the receiver 508 can be further arranged to incorporate any of the features discussed in connection with the other figures in this application.

The embodiments discussed above with respect to FIGS. 2 and 5 involve reflector segments that generally corresponded to quarter parabolic segments. Such arrangements are well suited for use in applications such as full trough collectors in which the receiver is located relatively far from the reflective surface, as for example, adjacent an upper edge of an opposing reflector. It should be apparent that the same principles can readily be applied to concentrating reflectors having a wide variety of geometries and regardless of where the receiver sits relative to the reflector surface. For example, in many applications it may be desirable to utilize a parabolic segment that has a shorter focal length than the reflector segment illustrated in FIG. 5. One such embodiment is illustrated in FIG. 6.

Figure 6:
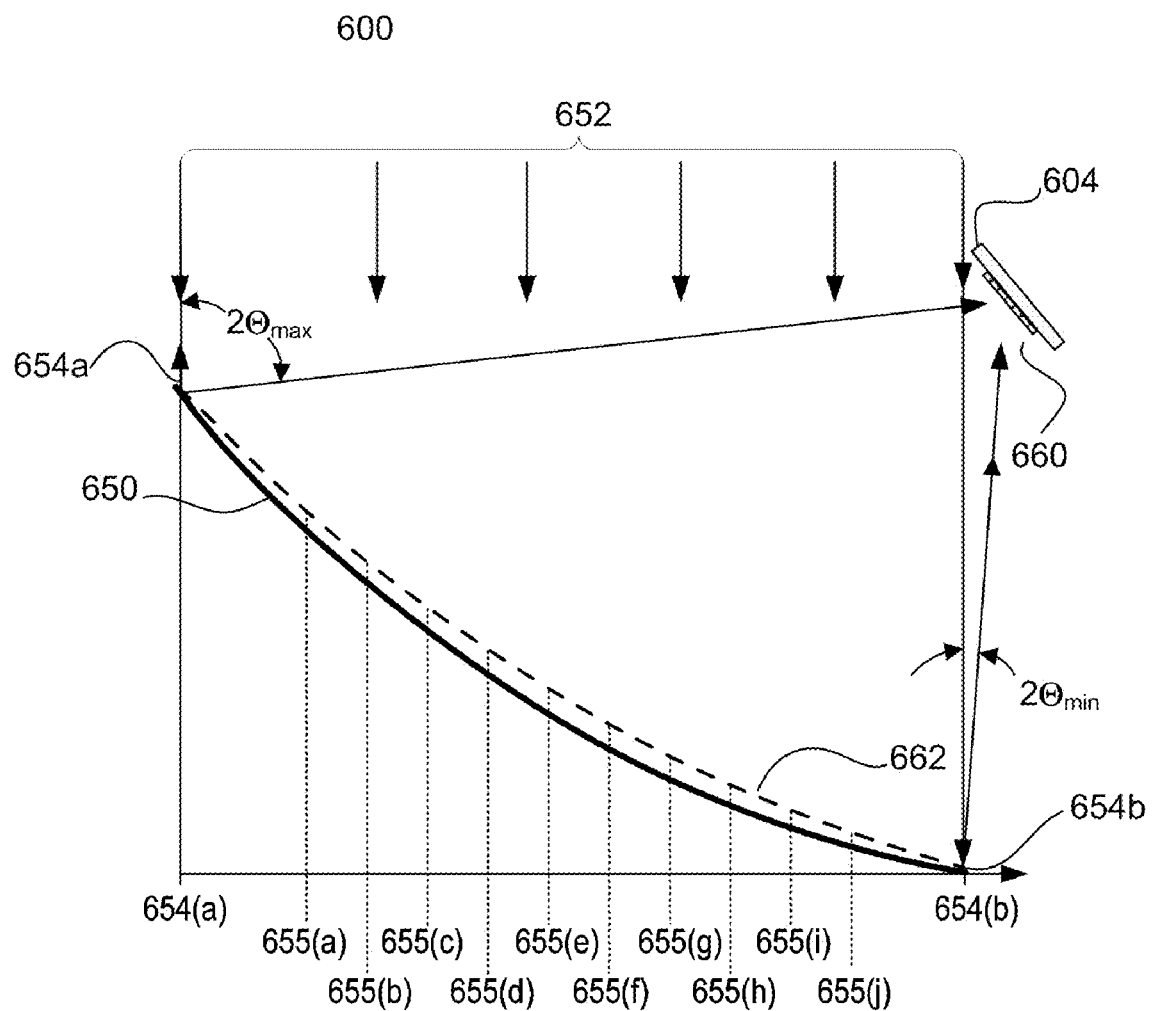
FIG. 6 is a diagrammatic cross-sectional view of a reflective surface and a receiver according to one embodiment of the present invention where the reflective surface is near half parabolic section.

In the embodiment of FIG. 6, a reflector 650 includes upper reflector edge 654a and lower reflector edge 654b. The reflector 650 has a shape that varies from a reference parabola segment 662 that has a focal point closer to the reflector than the embodiments illustrated in FIGS. 2 and 5. The reference parabola 662 is sometimes referred to herein as a near half parabola segment because lower edge 654b of the reflector is near the parabola's axis of symmetry. Stated another way, the bottom portion of the reference parabola is nearly parallel with the reference parabola's directrix.

The use of half or nearly half parabola reflectors has some potential advantages. Initially, the average distance between the reflective surface 650 and the flux line 660 is significantly less than the average distance in the quarter parabola segment illustrated in FIG. 2B. The closer flux line reduces the sensitivity of the system to tracking errors and mechanical imperfections since angular errors in the reflection result in less displacement at the flux line. In general, a reflector having a half parabola shape may have up to twice the aperture as a quarter parabola reflector for a given maximum distance between the reflector and the receiver.

Generally, rays of incoming sunlight 652 strike the reflective surface 650 at varying angles of incidence, Θ. The angle between the incident and the reflected rays is twice the angle of incidence, i.e., 2Θ. Rays incident at the lower trough edge 654b have the smallest angle of incidence, $\Theta_{min}$. Rays incident at the upper trough edge 654a have the largest angle of incidence, $\Theta_{max}$. The minimum and maximum angles of incidence will vary with the collector design although in nearly half parabola designs, $\Theta_{min}$ tends to be in the range of 0° to approximately 20° degrees and $\Theta_{max}$ tends to be in the range of 35° to 55°.

The receiver 604 may be oriented to minimize the angle of incidence of the reflected sunlight on the receiver. Minimizing the angle of incidence on the receiver has the advantages of reducing reflective losses on the receiver's optical surfaces because reflective losses tend to increase at larger angles of incidence. It also has some effect on minimizing the size of the flux line since the receiver is oriented as perpendicular as possible to the reflected sunlight. The optimal orientation for the receiver will vary based on the nature of the reflector design. In one specific example, if the range of incidence angles for a particular reflector have a range of 10° to 50° relative to a horizontal axis, it may be desirable to angle the receiver face at an angle on the order of 30° to minimize reflective losses. It should be appreciated, however, that although such an alignment of the receiver face may help reduce reflective losses, other factors such as thermal considerations may influence the actual receiver face orientation for a particular reflector design. Although the receiver orientation optimization has been described in the context of a near half parabola collector design, it should be appreciated that the orientation of the receiver may be optimized in this manner in any of the concentrating collector designs including the embodiments of FIGS. 2 and 5.

As with the previous described embodiments, the upper and lower edges 654a, 654b of the reflector 650 may be arranged to direct incident light towards the center of the receiver flux line. The reflector may be divided into three segments as discussed with respect to FIG. 5, or in any of a variety of other manners. By way of example, an alternative reflector geometry that is designed to provide a small, well-defined, uniform intensity, flux line that avoids a high intensity focal spot in front of the receiver will be described in conjunction with FIGS. 7A and 7B. A number of points on the lateral cross-section of the reflector surface shown in FIG. 6 are worthy of mention in this described embodiment. These include the upper edge 654a, the lower edge 654b, the midpoint 654c, and a number of inflection points 655a-j. For clarity is noted that the midpoint 654c is the midpoint of the collector aperture. That is, the midpoint 654c is a midpoint of the reflective surface relative to an X-axis that is parallel to the directrix of the reference parabola 662. Thus, it should be appreciated that the midpoint 654c is not positioned halfway between the upper edge 654(a) and the lower edge 655(b) of the reflector as viewed along the reflective surface. Similarly, it should be appreciated that in the discussion of the inflection points 655a-j below, the inflection points refer to positions of the reflective surface as defined relative to the X-axis.

Figure 7A:
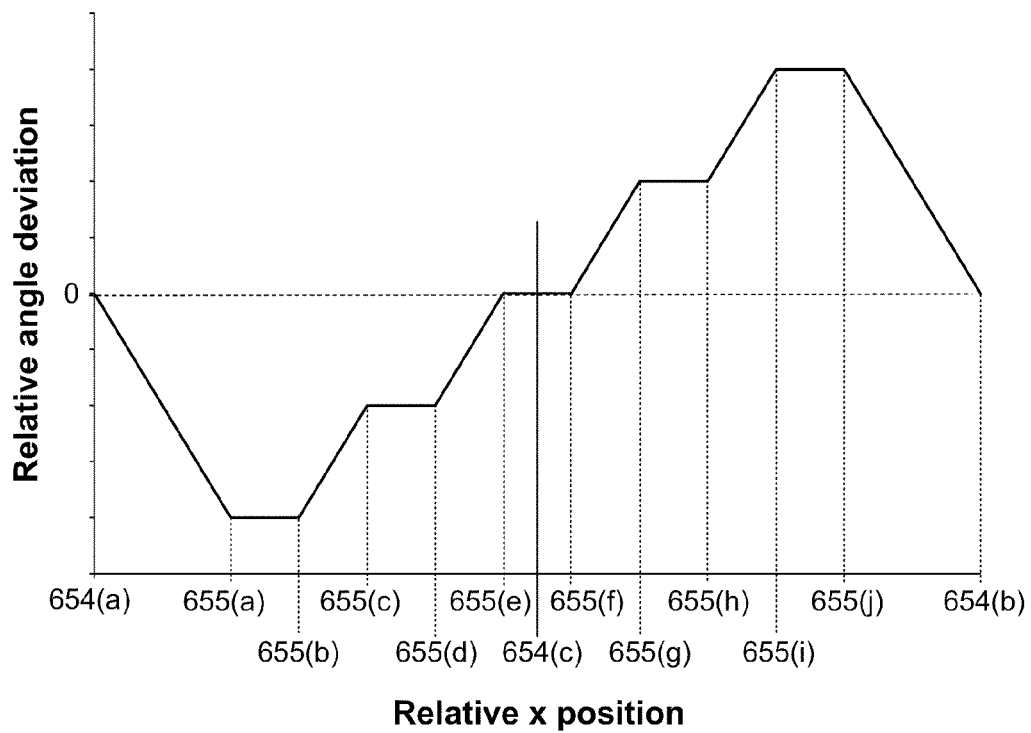
FIG. 7A is an exemplary graph depicting the relative angular deviation of a reflective surface from a reference parabola as a function of relative position along the reflective surface according to one embodiment of the present invention.
Figure 7B:
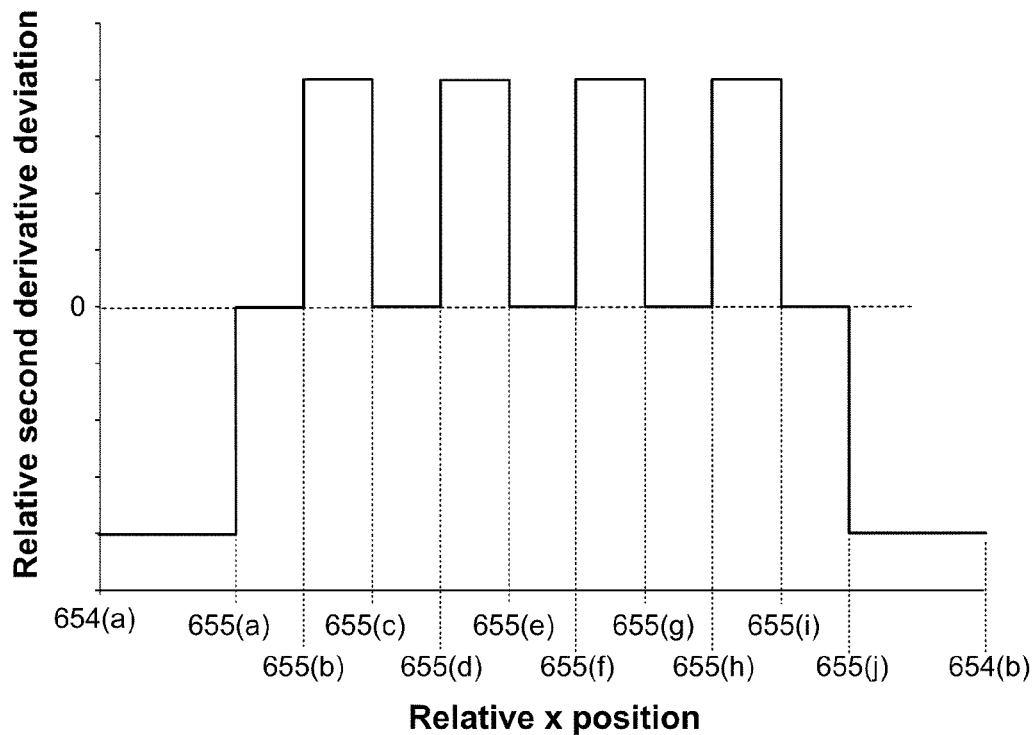
FIG. 7B is an exemplary graph depicting the relative second derivative deviation of the reflective surface of FIG. 7A from a reference parabola as a function of relative position along the reflective surface according to one embodiment of the present invention.

FIGS. 7A and 7Bb illustrate the angular and curvature deviation from a reference parabola associated with a more complex reflector geometry. FIG. 7A illustrates the relative angular deviation of the reflector surface relative to the reference parabola. FIG. 7B illustrates the second derivative deviation relative to the reference parabola. The angular deviation (α) of the reflective surface from the reference parabola may be defined mathematically using the following formula:

$$\alpha = \text{Arctangent}(dy/dx)$$

where dy/dx is the first derivative of the mathematical function that defines the reflective surface. FIG. 7B shows the corresponding second derivative deviation of the reflective surface relative to the reference parabola.

As best illustrated in FIG. 7A, starting at the upper edge 654a of the reflector surface, the reflective surface angle equals that of the reference parabola. The receiver is positioned such that reflected rays from this position strike the center of the receiver. The angular deviation from the reference parabola then increases linearly (by a negative amount) to point 655a on the reflector surface. The linearity of the angular deviation is reflected by a constant negative second derivative in the corresponding graph of FIG. 7B. It is noted that mathematically, the fact that the second derivative deviation from a reference parabola is constant and non-zero suggests that the curvature of the reflector surface in such a region is also parabolic in shape, although the focal point of such a parabolic segment will be displaced relative to the focal point of the reference parabola.

From point 655a to 655b, the changes in the curvature of the reflector surface match the changes in the curvature of the reference parabola as can be seen in both FIG. 7B, which means that the angular deviation from the reference parabola remains nominally constant in this region as seen in FIG. 7A. From point 655b to 655c, the angular deviation from the reference parabola is reduced linearly such that at point 655c, angular deviation of the reflector surface from the reference parabola is less than it was at point 655b. From point 655c to 655d, changes in the curvature of the reflector surface match the changes in the curvature of the reference parabola such that the angular deviation from the reference parabola remains nominally constant in this region. From point 655d the angular deviation from the reference parabola is further reduced linearly until point 655e at which point the reflector surface has an angle that is coincident with the angle of the reference parabola.

From point 655e to 655f, the curvature of the reflector surface matches the curvature of the reference parabola such that the reflector surface curvature matches the curvature of the reference parabola in this region (although the reflector surface would be physically located behind the reference parabola). From point 655f, the angular deviation from the reference parabola is further increased linearly to point 655g on the reflector surface such that the reflector surface angle now deviates from the reference parabola by a positive amount. From point 655f to 655h, changes in the curvature of the reflector surface match the changes in the curvature of the reference parabola such that the angular deviation from the reference parabola remains nominally constant in this region (and thus the second derivative in this region is again zero). From point 655h, the angular deviation from the reference parabola is further increased linearly until point 655i which results in an even greater angular deviation from the reference parabola. In this region the second derivative has a constant value.

From point 655i to 655j, changes in the curvature of the reflector surface again match the changes in the curvature of the reference parabola such that the angular deviation from the reference parabola remains nominally constant in this region. The angular deviation from the reference parabola is then decreased linearly from point 655j to the lower edge 654b of the collector.

In general, regions of negative linear angular deviation correspond to constant negative second derivative deviation values. These regions focus light behind the reference parabola focal point. The regions of constant angular deviation correspond to values of zero second derivative deviation. These regions effectively focus light in a manner similar to the reference parabola. The regions of positive linear angular deviation correspond to constant positive second derivative deviation values. These regions focus light in front of the reference parabola focal point.

The reflective surface profile depicted in FIGS. 7A and 7B has the desirable attribute of producing a small, well-defined, uniform-intensity flux line. It also has the advantage of avoiding a high intensity focal spot in front of the receiver. As best seen in FIG. 7B, the regions at the edges of the reflective surface have smaller second derivative values than the reference parabola (i.e., the region 654a-655a and the region 655j-654b). These regions have less curvature than the reference parabola and produce foci behind the receiver. The receiver therefore blocks rays reflected from these segments before they reach the foci.

The central region of the reflector is divided into eight smaller segments. Four of these segments have positive second derivative deviation values (i.e., regions 655b-655c; 655d-655e; 655f-655g and 655h-655i). These four regions have an increased curvature relative to the reference parabola and therefore each have a focus in front of the receiver. However, since the reflective area associated with each positive curvature deviation region is relatively small, the intensity of the associated focus is more modest. The other four segments in the central region have a second derivative deviation value of zero, which means that their rate of angular change matches that of the reference parabola (i.e., regions 655c-655d; 655e-655f; 655g-655h and 655i-655j). Thus, they focus in a manner similar to the reference parabola.

In the illustrated embodiment, the absolute values of each of the non-zero second derivative deviations from the reference parabola are the same. Reflector segments that have a zero second derivative deviation from the reference parabola are interspersed between adjacent non-zero segments. Such an interleaved arrangement works well, although it is not required. The width of the eight segments in the central region are all the same (i.e., regions 655b-655c; 655c-655d; 655d-655e; 655e-655f; 655f-655g; 655g-655h; 655h-655i and 655i-655j). The two end segments (i.e., regions 654a-655a and 655j-654b) are each twice as wide as the central segments. With this arrangement, the positive deviation from the reference parabola is offset by the negative deviations over the face of the reflector. It is worth noting that in the illustrated embodiment, the integral of the second derivative deviation over the X-axis is nominally zero. Generally, in order to have a small, well defined flux line at the receiver it is desirable that the integral of the second derivative deviation over the X-axis position be nominally zero.

Although the specific curvatures illustrated in FIGS. 7A and 7B work well, it should be appreciated that the actual geometry of the reflector surface may be widely varied to accomplish the same purpose. Thus, for example, the number of distinct segments and their relative widths can be widely varied. In the illustrated embodiment, segments that match the curvature variations of the reference parabola are interspersed with segments that vary from the reference parabola. In other embodiments, such segments could be eliminated, additional such segments may be added or they could be replaced by intermediate sections having different values. In the illustrated embodiment, the various segments have constant second derivative deviation values. Again, this is not necessary, and they could be replaced with segments of varying second derivative deviation values, although in general that may complicate the design somewhat. Furthermore, it should be appreciated that the described type of angular and derivative deviation from a reference parabola may be applied to any type of parabola segment, including quarter parabola reflectors, half parabola reflectors, near half parabola reflectors, full parabola reflectors and others.

In the illustrated embodiment, the interfaces between adjacent sections are angularly and spatially continuous which is advantageous when forming the reflector from a single sheet. This is partially due to the fact that it is generally more difficult to reliably form angular discontinuities in a reflector sheet. However, as will be described in more detail below, in alternative embodiments the reflector may be formed from spatially and/or angular discontinuous segments. In still other embodiments, the described designs can be beneficially combined with secondary optics adjacent to the receiver to increase the flux line intensity and uniformity.

Figure 9:
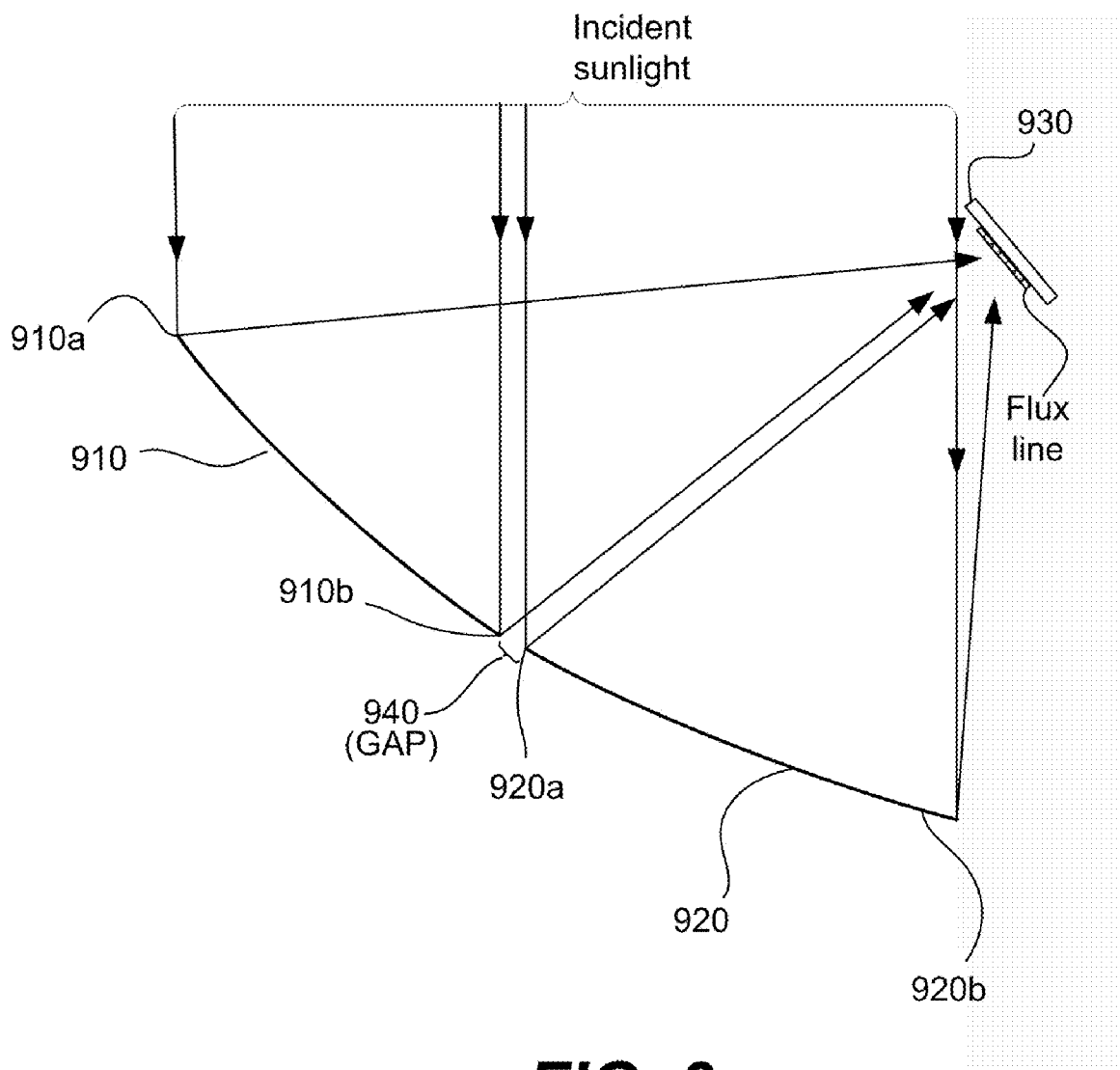
FIG. 9 is a diagrammatic cross-sectional view of a reflective surface and a receiver according to one embodiment of the present invention where the reflective surface which concentrates sunlight on a single receiver is divided into a plurality of reflective surface sections.

Referring next to FIG. 9, an alternative reflector geometry that includes a plurality of distinct reflector segments will be described. In the illustrated embodiment, the collector is formed from a pair of spaced apart reflector segments, although it should be appreciated that in other embodiments, more than two reflector segments may be used. The illustrated collector includes an upper reflector segment 910 and a lower reflector segment 920 that both reflect incident radiation to the same receiver 930. The reflector segments 910 and 920 are independent and each segment may be independently arranged to deviate from an associated reference parabola in the manner described above with respect to the other embodiments. That is, each reflector segment 910, 920 may be configured such that its edge regions direct reflected sunlight towards a central portion of the receiver 930. Thus, sunlight reflected from both the upper edge 910a and the lower edge 910b of the upper reflective surface 910 may be directed to a central region of the receiver 930. Similarly, sunlight reflected from both the upper edge 920a and the lower edge 920b of the lower reflective surface 920 may be directed to the central region of the receiver 930. The sunlight reflected from central regions of the upper and lower reflective surfaces may be directed to different parts of the receiver 930 in the manner described above.

The reflector segments may be separated by a small gap 940 so that the reflective surfaces are spatially discontinuous. Preferably the gap 940, if present, would be quite small so that little solar radiation is lost through the gap. In other embodiments, the reflective surfaces may be arranged to overlap one another. In still other embodiments, the reflective surfaces may generally abut one another or may be radially offset from one another without a forming a gap through which sunlight can pass. An advantage of allowing a small gap is ease of assembly and alignment, while an advantage of using overlapping or reflector segments is that the collector can have slightly higher efficiency due to reduced loses.

The split reflector arrangement has several potential advantages. Initially, for a given collector aperture, the size (i.e., width) of each reflective surface is smaller than the width the reflective surface would be if it was formed by a single reflective surface. In some embodiments, the smaller width of reflective surface may be more compatible with low cost, high volume manufacturing than larger width reflectors. This is particularly noticeable when the sheets of metal used to form the reflector surface are more than a couple meters wide. In one specific example, conventional metal forming equipment used to shape automobile body parts may be readily adapted to produce relatively large width reflectors. However, lower cost versions of such equipment are not generally suited for handling metal sheets having a width of more than about 1.5-2 meters. When it is desirable to form large collectors having wider reflective surface than can be accommodated by such equipment, it can be cost effective from a manufacturing standpoint to split the reflective surface into a plurality of distinct reflective sections as described herein. The split reflective surfaces can also be advantageous from an assembly standpoint in large aperture collector systems because the smaller width panels used to form the reflectors may be easier to handle and align during assembly than very wide panels.

Figure 8A:
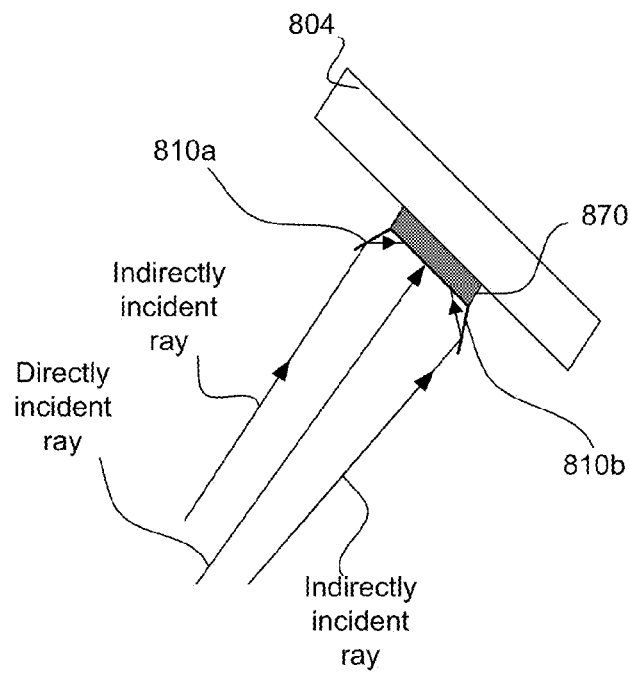
FIG. 8A is a diagrammatic cross-sectional view of a receiver with adjacent secondary optics where the secondary optics are flat mirrors.

One of the challenges of building concentrating solar collectors is to insure that the reflective surfaces are properly aligned relative to the receiver and that the tracking system adequately tracks movements of the sun throughout the day and over the course of changing seasons. There can be significant losses in system efficiency if some of the reflected sunlight does not strike the active portion of the receiver (e.g., active portions of the photovoltaic cells). In some embodiments it may be desirable to include secondary optics (e.g. mirrors) on the receivers to direct reflected light that would otherwise miss the active portions of the receiver back towards the receiver. Such receiver enhancements will be described with respect to FIGS. 8A and 8B. Referring initially to FIG. 8A, receiver 800 includes a base 804 and a photovoltaic cell 870. The photovoltaic cell 870 may be an individual cell, a cell in an elongated string of cells or multiple adjacent cells. The receiver further includes a pair of longitudinally extending mirrors 810a and 810b located on opposite sides of the photovoltaic cell string 870. The mirrors 810a and 810b cooperate to form secondary optics 810. The mirrors are oriented such that light reflected from the reflector that strikes one of the mirrors is directed to the photovoltaic cell 870.

Figure 8B:
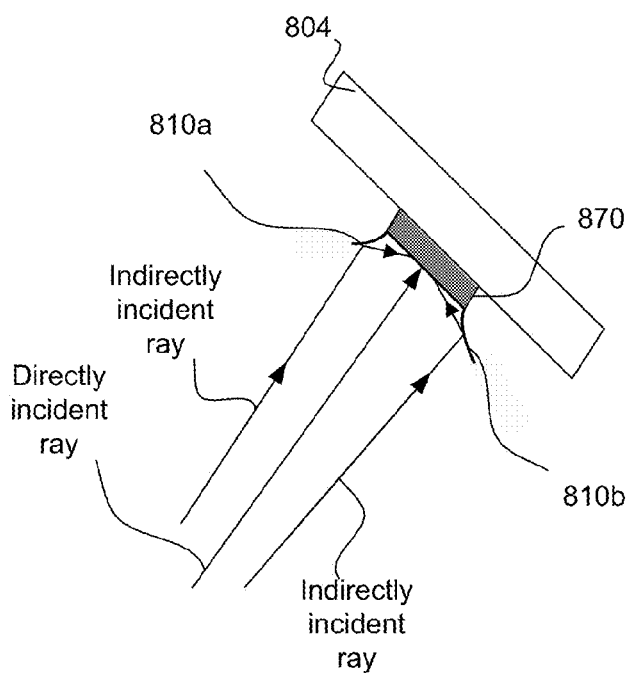
FIG. 8B is a diagrammatic cross-sectional view of a receiver with adjacent secondary optics where the secondary optics are outwardly curved mirrors.

The mirrors may optionally be fabricated from the same material as the reflective trough although this is not a requirement. In the embodiment illustrated in FIG. 8A, the mirrors are flat which tends to help minimize their fabrication costs. However, in alternative embodiments, the mirrors may be outwardly curved as illustrated in FIG. 8B.

The secondary optics 810 may be used in a variety of manners. In some embodiments, the secondary optics may be used only to provide tolerances for alignment and tracking. However, in other embodiments, the secondary optics may be designed to provide further concentration. That is, selected portions of the reflector may be designed to intentionally direct light towards mirrors—which in turn reflect such light towards the photovoltaic cells—while other portions of the reflector are designed to direct light directly towards the photovoltaic cells.

One particularly useful applications of the mirror type secondary optics is to direct light from reflective sections that have foci in front of receiver. For example, in some applications it may be desirable to orient the reflector surface such that rays reflected from the lower trough edge (e.g., 654(b) in FIG. 6) strike the upper mirror 810a and are then reflected a second time towards the photovoltaic cell 870. Similarly rays originating reflected from the upper trough edge (e.g., 654(a) in FIG. 6) may be directed to the lower mirror 810b.

The actual size and orientation of the mirrors may be widely varied to meet the needs of any particular circumstance. By way of example, in a receiver designed for use in quarter parabola type collector systems as illustrated in FIG. 2, using secondary optics mirrors having a length approximately the same as the width of the flux line that are oriented at 80° relative to the face of the photovoltaic cells may effectively increase the target area for capturing reflected sunlight by 35%. Of course the appropriate values for the actual length and orientation of the secondary optics mirrors will may significantly based on the geometry of the reflector and the orientation of the receiver.

Using secondary optics of the nature described with reference to FIGS. 8A and 8B has several potential advantages. For example, the use of secondary optics may permit the photovoltaic cells 870 to be smaller, thereby reducing system cost. The secondary optics also permit the solar concentration factor to be increased, thereby improving cell efficiency. By way of example, a standard parabolic trough may operate with a 10× concentration factor. Use of the secondary optics may allow the solar concentration factor to increase to 20×. The effects of the secondary optics may also be considered in the design of the reflector surface geometry in a manner that allows the photovoltaic cells to be illuminated more uniformly, which tends to lead to increased cell efficiency. As mentioned earlier, the described designs provide a larger target area (i.e., the combination of the photovoltaic cell and the secondary optics) which may allows tracking and mechanical tolerances to be relaxed without requiring a larger cell size.

Although only a few embodiments of the invention have been described in detail, it should be appreciated that the invention may be implemented in many other forms without departing from the spirit or scope of the invention. In the foregoing description, for example, there are references to a receiver. A receiver can be understood as one or more solar cells or a structure that includes one or more solar cells. In the foregoing description, there are characterizations of the shape, angle and geometry (e.g., "parabolic," "normal to incident sunlight") of various structures (e.g., "reflective surface"). Such characterizations are not intended to be unduly limiting and contemplate that the described structures may be approximately similar to but may not perfectly satisfy the ideal mathematical criteria for the cited shapes, angles and geometries. For example, a phrase such as "a section of the reflective surface can form a parabolic curve" can also be understood as "a section of the reflective surface forms a shape approximately similar to a parabolic curve," "a section of the reflective surface at least substantially forms a parabolic curve," etc. Additionally, in the foregoing descriptions there are references to a point on a curve, reflective surface and/or receiver. Such descriptions can also be understood as referring to a small portion, distance and/or interval on the same.

In many of the reflector geometries described above, edge regions of the reflective surfaces direct incident solar radiation towards a central region of the receiver. The targeted central region of the receiver is not necessarily the midpoint of the receiver, although the midpoint is a useful reference point in some implementations. Thus, for example, in some specific embodiments it may be desirable to direct rays from the upper edge of the receiver towards a specific central region of the receiver (e.g., toward a position $\frac{1}{3}^{rd}$ of the flux line width from the bottom of the flux line) while directing rays from the lower edge of the receiver toward a distinct specific central region of the receiver (e.g., toward a position $\frac{1}{3}^{rd}$ of the flux line width from the top of the flux line). Of course the actual target position for rays reflected from the upper and lower edges of the reflector can be widely varied within the scope of the present inventions.

The reflector geometry enhancements discussed above have primarily been described in the context of photovoltaic concentrating solar systems. However, it should be appreciated that the same principles apply to any concentrating solar system, regardless of the nature of the receiver. Thus, it should be appreciated that the described improvements are equally applicable to concentrating solar systems that utilize thermal receivers. Therefore, the present embodiments should be considered as illustrative and not restrictive and the invention is not limited to the details given herein, but may be modified within the scope and equivalents of the appended claims.

What is claimed is:

1. A solar energy collector suitable for use in a solar energy collection system that tracks movements of the sun along at least one axis, the collector comprising:
   a solar receiver;
   a reflective surface including a first edge and an opposing second edge, wherein the reflective surface is arranged to direct light to the receiver in a non-imaging manner to form a flux line on the receiver, wherein solar rays reflected from the opposing edges of the reflective surface are directed towards a central portion of the flux line and solar rays reflected from selected central portions of the reflective surface are directed closer to edge portions of the flux line than the solar rays reflected from the edges of the reflective surface.

2. A solar energy collector as recited in claim 1 wherein the reflective surface is angularly and spatially continuous.

3. A solar energy collector as recited in claim 1 wherein the collector includes a plurality of distinct reflective surfaces arranged to simultaneously direct incident light to overlapping portions of the same solar receiver, wherein the reflective surfaces are each individually angularly and spatially continuous, but the reflective surfaces are at least one of angularly and spatially discontinuous relative to one another.

4. A solar energy collector as recited in claim 1 wherein the collector has a geometry configured to direct incident solar rays reflected from a first central portion of the reflective surface generally closer to a first edge portion of the receiver and to direct incident solar rays reflected from a second central portion of the reflective surface generally closer to a second edge portion of the receiver located opposite the first edge portion of the receiver.

5. A solar energy collector as recited in claim 1 wherein the reflective surface includes a plurality of reflective sections, wherein at least some of the reflective sections vary from a reference parabola that approximates a cross sectional shape of the reflective surface.

6. A solar energy collector as recited in claim 5 wherein in a first one of the reflective sections, an angular deviation of the reflective surface from the reference parabola varies substantially linearly such that a second derivative deviation of the reflective surface from the reference parabola is substantially constant.

7. A solar energy collector as recited in claim 6 wherein multiple sections of the reflective surface have substantially constant second derivative deviations from the reference parabola.

8. A solar energy collector as recited in claim 7 wherein the absolute values of the second derivative deviations associated with the each of the multiple sections of the reflective surface are approximately equal.

9. A solar energy collector as recited in claim 5 wherein the reference parabola is selected from the group consisting of: a quarter parabola, a half parabola and a near half parabola.

10. A solar energy collector as recited in claim 1 wherein the reflective surface includes a plurality of reflective sections, each of the reflective sections having a substantially parabolic shape, wherein the directrices of at least some of the reflective sections vary.

11. A solar energy collection system comprising:
    a solar collector as recited in claim 10; and
    a tracking system configured to direct incident sunlight towards the plurality of reflective sections such that the incident sunlight is substantially normal to a directrix of a reference parabola that approximates a cross sectional shape of the reflective surface.

12. A solar energy collector as recited in claim 1 wherein the reflective surface is arranged to direct the sunlight towards the solar receiver using a single reflection during operation of the collector.

13. A solar energy collector as recited in claim 1 wherein the receiver includes secondary optics situated adjacent to a flux line that directs reflected sunlight towards the solar receiver.

14. A solar energy collector as recited in claim 13 wherein the secondary optics includes two, nominally flat mirrors.

15. A solar energy collector as recited in claim 1, wherein:
    light reflected from the reflective surface onto the solar receiver forms a flux line on the solar receiver; and
    the variation in intensity over a middle section of the flux line being less than 20%, wherein the middle section of the flux line includes at least 90% of the energy of the flux line.

16. A solar energy collector as recited in claim 1 wherein the reflective surface is configured to avoid a high intensity focal spot in front of the receiver.

17. A solar energy collector as recited in claim 1 wherein:
    the reflective surface is configured to reflect the incident sunlight to form a flux line on the solar receiver and includes a reflective midpoint between the first and second edge;
    the reflective surface includes a first reflective region that is bordered by the first edge and the reflective midpoint and a second reflective region that is bordered by the second edge and the reflective midpoint;
    the first edge, the second edge and the reflective midpoint are adapted to reflect the incident sunlight substantially toward the center of the solar receiver flux line;

the first reflective region is adapted to reflect the incident sunlight substantially along a first half of the flux line; and the second reflective region is adapted to reflect the incident sunlight substantially along a second half of the flux line that is substantially distinct from the first half of the flux line.

18. A solar energy collector as recited in claim 1 wherein the receiver includes at least one string of photovoltaic solar cells.

* * * * *